United States Patent
van den Heuvel

(10) Patent No.: US 10,044,534 B2
(45) Date of Patent: Aug. 7, 2018

(54) RECEIVER INCLUDING A PLURALITY OF HIGH-PASS FILTERS

(71) Applicant: Stichting IMEC Nederland, Eindhoven (NL)

(72) Inventor: Johan van den Heuvel, Geldrop (NL)

(73) Assignee: Stichting IMEC Nederland, Eindhoven (NL)

( * ) Notice: Subject to any disclaimer, the term of this patent is extended or adjusted under 35 U.S.C. 154(b) by 0 days.

(21) Appl. No.: 15/591,895

(22) Filed: May 10, 2017

(65) Prior Publication Data

US 2017/0331652 A1 Nov. 16, 2017

(30) Foreign Application Priority Data

May 11, 2016 (EP) ..................................... 16169134

(51) Int. Cl.
*H04L 27/14* (2006.01)
*H04L 25/06* (2006.01)
(Continued)

(52) U.S. Cl.
CPC ............ *H04L 25/061* (2013.01); *H03D 3/00* (2013.01); *H04B 1/00* (2013.01); *H04L 1/206* (2013.01);
(Continued)

(58) Field of Classification Search
CPC ..... H04L 25/061; H04L 27/16; H04L 27/142; H04L 27/148; H04L 27/227; H04L 1/206; H04L 2027/0026; H04B 1/00; H03D 3/00
(Continued)

(56) References Cited

U.S. PATENT DOCUMENTS 5,894,499 A * 4/1999 Katayama ........... H04L 27/2273
375/334
7,110,477 B2 9/2006 Suissa et al.
(Continued)

FOREIGN PATENT DOCUMENTS

EP 2 905 905 A1 8/2015

OTHER PUBLICATIONS

Bluetooth Specification v4.0, vol. 6, Part F; Direct Test Mode, Dec. 17, 2009, 26 pages.
(Continued)

*Primary Examiner* — Siu Lee
(74) *Attorney, Agent, or Firm* — McDonnell Boehnen Hulbert & Berghoff LLP

(57) ABSTRACT

Embodiments described herein include a receiver, a method, and a plurality of high-pass filters for demodulating a radio frequency (RF) signal. An example receiver includes a plurality of high-pass filters. The receiver includes a demodulator configured to demodulate an RF signal received at an input of the demodulator and configured to output a demodulated signal. The receiver also includes a plurality of high-pass filters connected to an output of the demodulator. The plurality of high-pass filters are configured to receive the demodulated signal and configured to high-pass filter the demodulated signal. The plurality of high-pass filters are configured to operate with a first set of filter responses during a first time period of the demodulated signal and configured to operate with a second set of filter responses during a second time period of the demodulated signal.

20 Claims, 7 Drawing Sheets

(51) Int. Cl.
*H04L 1/20* (2006.01)
*H04L 27/148* (2006.01)
*H04L 27/227* (2006.01)
*H03D 3/00* (2006.01)
*H04B 1/00* (2006.01)
*H04L 27/16* (2006.01)
*H04L 27/00* (2006.01)

(52) U.S. Cl.
CPC .......... *H04L 27/142* (2013.01); *H04L 27/148* (2013.01); *H04L 27/16* (2013.01); *H04L 27/227* (2013.01); *H04L 2027/0026* (2013.01)

(58) Field of Classification Search
USPC .................... 375/344, 316, 259, 260, 319
See application file for complete search history.

(56) References Cited

U.S. PATENT DOCUMENTS

| | | | |
|---|---|---|---|
| 7,280,618 B2 * | 10/2007 | Demir | H03D 3/009 375/316 |
| 8,050,368 B2 | 11/2011 | Lerner et al. | |
| 8,411,805 B1 | 4/2013 | Lee et al. | |
| 8,644,426 B1 | 2/2014 | Zhou et al. | |
| 9,042,489 B2 | 5/2015 | Lai | |
| 2004/0097212 A1 * | 5/2004 | Matsumoto | H03G 3/3068 455/296 |
| 2006/0240779 A1 | 10/2006 | Rostami et al. | |
| 2009/0022246 A1 * | 1/2009 | Ando | H04B 1/0067 375/319 |
| 2010/0223054 A1 * | 9/2010 | Nemer | H04R 3/007 704/219 |
| 2011/0044414 A1 * | 2/2011 | Li | H04B 1/1081 375/350 |

OTHER PUBLICATIONS

Bluetooth Low Energy RF PHY Test Specification, Document No. RF-PHY.TS.4.1.0, Dec. 3, 2013, 46 pages.

\* cited by examiner

RECEIVER INCLUDING A PLURALITY OF HIGH-PASS FILTERS

CROSS-REFERENCE TO RELATED APPLICATIONS

The present application is a non-provisional patent application claiming priority to European Patent Application No. EP 16169134.0, filed May 11, 2016, the contents of which are hereby incorporated by reference.

FIELD OF THE DISCLOSURE

The present disclosure generally relates to wireless telecommunication receivers, and in particular to wireless telecommunication receivers using Bluetooth low energy (BLE).

BACKGROUND

Bluetooth technology is a short-range communications technology for a wide range of devices ranging from mobile phones and computers to medical devices and home entertainment products. As of Bluetooth v4.0 the Bluetooth standard includes Bluetooth Low Energy (BLE), which is built upon the original key features of Bluetooth but also applies to devices that operate with ultra low power wireless connectivity.

Any BLE receiver may be configurable to receive dirty packets (dirty Tx) as specified in the BLE test specification document "Bluetooth Low Energy RF PHY Test Specification" (RF-PHY.TS.4.1.0). Every 50 packets, the carrier frequency offset (CFO), modulation index (h), and symbol timing error ($t_{error}$) are changed to specific value combinations described in the test specification and shown in table 1 below.

TABLE 1

Transmitter parameters for dirty packets

| Test run | CFO | h | $t_{error}$ |
|---|---|---|---|
| 1 | 100 kHz | 0.45 | −50 ppm |
| 2 | 19 kHz | 0.48 | −50 ppm |
| 3 | −3 kHz | 0.46 | +50 ppm |
| 4 | 1 kHz | 0.52 | +50 ppm |
| 5 | 52 kHz | 0.53 | +50 ppm |
| 6 | 0 kHz | 0.54 | −50 ppm |
| 7 | −56 kHz | 0.47 | −50 ppm |
| 8 | 97 kHz | 0.5 | −50 ppm |
| 9 | −25 kHz | 0.45 | −50 ppm |
| 10 | −100 kHz | 0.55 | +50 ppm |

In addition to fixed frequency offset, a defined frequency drift is added to the signal characteristics. This is implemented by adding a sinusoidal low frequency modulation to the signal, with deviation of 50 kHz and a modulation frequency of 625 Hz. The modulating signal is synchronized with the packets so that each alternating packet starts at 0° and 180° of the modulating signal.

That is, a dirty Tx has both an initial carrier frequency offset (CFO) and a carrier frequency drift during transmission.

One of the difficulties is to timely estimate and correct the CFO because the preamble is short (1 octet) and the start of frame delimiter (SFD) should be received in a bit-correct manner. Moreover the drift can be tracked during payload reception.

SUMMARY

In view of the above, embodiments provide a receiver with increased capabilities to correctly estimate a CFO and a carrier frequency drift during packet transmission. This and other objects are achieved by providing a receiver and a method having the features defined in the independent claims. Additional embodiments are defined in the dependent claims.

According to a first aspect, a receiver is provided. The receiver comprises a demodulator adapted to demodulate a radio frequency (RF) signal received at an input thereof and to output a demodulated signal. The receiver comprises a plurality of high-pass filters connected to an output of the demodulator for receiving and high-pass filtering the demodulated signal, wherein the plurality of high-pass filters are adapted to operate with a first set of filter responses during a first time period of the demodulated signal and operate with a second set of filter responses during a second time period of the demodulated signal.

According to a second aspect, a method is provided for processing a received signal comprising a modulated carrier signal of a predetermined frequency, wherein the carrier signal comprises a carrier frequency offset. The method comprises demodulating the received carrier signal, receiving the demodulated signal in a plurality of high-pass filters, and high-pass filtering the demodulated signal using a first set of filter responses for the plurality of filters during a first time period of the demodulated signal and high-pass filtering the demodulated signal using a second set of filter responses for the plurality of filters during a second time period of the demodulated signal.

Thus, some embodiments are based on the idea of providing a device and method using a plurality of filters which may be dynamically optimized for filtering different parts of the received signal. As the filters are adapted to operate with a first set of filter responses during a first time period of the demodulated signal, and operate with a second set of filter responses during a second time period of the demodulated signal, it is, at different times during reception of the signal, possible to monitor the filtered signals at the outputs of the filters and select one of the filtered signals, which have been filtered at a desired level according to one filter response of the first or second set of filter responses, for further processing.

By the term "receiver" is here in general meant any type of device that is capable of receiving a radio frequency signal, and in particular a device that is adapted to receive radio frequency signals that are transmitted according to the Bluetooth standard operating in the 2.4 GHz Industrial Scientific Medicine (ISM) band.

By the term "demodulator/demodulating" is here generally meant a unit or function in which an information-bearing signal is extracted from a modulated carrier wave. The demodulator may be implemented by electronic circuitry, computer program code portions which when executed in e.g. digital signal processor perform the function of the demodulator, or a mix thereof, which is used to recover the information content from the modulated carrier wave. In some embodiments, the carrier is modulated using Gaussian Frequency Shift Keying (GFSK). Other types modulation, such as Frequency Shift Keying (FSK) and variants thereof (e.g. CPFSK, MSK and GMSK), Phase shift Keying (PSK) and variants thereof (e.g. BPSK, pi/2 DBPSK, pi/4 DQPSK, OQPSK, SOQPSK and DPQPSK) may also be used. The signal output from the demodulator may be an analog or digital signal.

The term "high-pass filter" herein includes a unit that comprises filters that pass signals with a frequency higher than certain cutoff frequencies and attenuates signals with frequencies lower than the cutoff frequencies. The high-pass filter may be implemented by electronic circuitry, computer program code portions, or a mix thereof. The amount of attenuation for each frequency depends on the filter design. The filter may be of a first or higher order. In some embodiments, each filter in the high-pass filter is implemented as a digital filter comprising a differentiator and an integrator as disclosed in more detail below.

By the term "a plurality of filters adapted to operate with a first set of filter responses" is here meant that each filter of the plurality of filters is defined by one or more filter parameters controlling the cutoff frequency and/or stop band attenuation of the filter. Thus, each filter of the plurality of filters may provide a specific response to a signal applied at its input.

By the term "first/second time period of the demodulated signal" is here meant a first and second period in time, each defined by a start time and a stop time, during which a first and second portion of the demodulated signal is received by the high-pass filter. As disclosed in more detail below, the first and second time period may be predefined time periods or may be time periods resulting from events such as the detection of a specific pattern in the demodulated signal.

According to example embodiments, each filter response in the first set of filter responses has a corresponding filter response in the second set of filter responses, wherein each of the corresponding filter responses in the second set of filter responses is slower than the corresponding first filter response.

By providing a filter response in the second set of filter responses that is slower than a corresponding filter response in the first set of filter responses it is possible to control the amount of filtering applied to different parts of the demodulated signal. By way of example, if the content of demodulated signal during the second time period is more sensitive to filtering, i.e. is more prone to be corrupted should it be filtered too aggressively, it is hence possible to provide a first, more aggressive level of filtering during the first time period, and a second, less aggressive level of filtering during the second time period.

By the term "corresponding filter response" is here meant that in the first set of filter responses are a number of responses defined by filter parameters $\alpha[1]$, $\beta[1]$, $\gamma[1]$, etc., and in the second set of filter responses are a number responses defined by filter parameters $\alpha[2]$, $\beta[2]$, $\gamma[2]$, etc., wherein the filter response defined by filter parameter $\alpha[1]$ ($\beta[1]$, $\gamma[1]$, etc.) in the first set of filter responses has a corresponding filter response defined by filter parameter $\alpha[2]$ ($\beta[2]$, $\gamma[2]$, etc.) in the second set of filter responses.

By the term "slower" is here meant that the filter response is less aggressive such that a lower level of filtering is achieved.

According to example embodiments, the receiver is adapted to receive an RF signal in the form of a modulated carrier signal with a predetermined carrier frequency, and wherein the demodulator is adapted to demodulate a carrier frequency offset, CFO, present in the RF signal into a DC offset.

Some embodiments may facilitate subsequent processing of the received data in order to correct the received data with a CFO estimate. That is, by demodulating the CFO into a DC offset, a high-pass filter may be selected for subsequent filtering such that the CFO may be compensated for.

The DC offset may be represented by an analog or digital signal. The predetermined carrier frequency depends on the communication standard employed. According to an example embodiment, the predetermined carrier frequency corresponds to a center frequency defined according to the Bluetooth low energy standard operating in the ISM frequency band located at 2400 MHz to 2483.5 MHz. In particular, the Bluetooth low energy system uses center frequencies $2402+n \times 2$ MHz, where $n=0, 1, 2, \ldots, 39$. Any offset from the center frequency will hence result in a DC offset corresponding to the frequency offset.

According to example embodiments, the receiver comprises a selector adapted to select one of the plurality of filters based on the CFO.

In some embodiments, based on the amount of CFO/DC offset present in the received signal, a filter may be selected for processing the demodulated signal.

The selector may be in the form of a unit implemented in hardware, software or a combination of both, whose function in general terms is to provide the output signal from one of the filters to other units for subsequent processing. According to an example embodiment the selector comprises a measuring unit for determining the amount of CFO/DC offset present in the demodulated signal, and a multiplexing unit for selecting one of a plurality of analog or digital input signals received from the plurality of filters and forward it to its output. The multiplexing unit may comprise one or more controllable switches, e.g. analog switches or digital gates, which are controlled by signals received from the measuring unit.

According to example embodiments, the demodulator is a differential phase-domain demodulator.

By providing a differential phase-domain demodulator a CFO present in the received signal will be directly demodulated into a DC offset at the output of the demodulator. Thus, the complexity of the receiver will be reduced since no further processing of the demodulated signal, in order to derive a DC offset signal, is needed before providing the demodulated signal to the high-pass filter.

According to example embodiments, the demodulated signal is in the form of a data packet.

By providing a receiver comprising a demodulator adapted to demodulate the received signal into data packets, the selection of filters and filter responses for processing different parts of the demodulated signal is facilitated. That is, a first filter operating with a first filter response may be used for filtering a first part of the packet depending on the assumed content of the first part of the packet (such as a preamble), and a corresponding (or different) filter operating with a second filter response may be used for filtering a second part of the packet (such as a synchronization word or payload of the packet).

The data packet may take various forms depending on the communication standard employed. By way of example, a standard BLE packet comprises a preamble (1 octet), an address word (4 octets), PDU (2-39 octets) and CRC (3 octets). For testing purposes a packet format as defined in the test specification document is used, wherein the reference packet comprises a preamble (1 octet), a synchronization word (4 octets), a PDU header (1 octet), PDU length data (1 octet), PDU payload (37 octets) and CRC (3 octets). Other packet formats, such as employed in IEEE802.15.4 (ZigBee) or IEEE802.15.6 (Wireless Body Area Network) may also be used.

According to example embodiments, the high-pass filters may be adapted to operate with the first set of filter responses on a first part of the data packet and the second set of filter responses on a second part of the data packet.

Different parts of the packet may be more or less aggressively filtered in various embodiments. Thus, payload data in the packet, which likely is more sensitive to filtering, i.e. is more prone to be corrupted should it be filtered too aggressively compared to e.g. the preamble, may be subject to a less aggressive filter operating with a slower set of filter responses.

By the terms "first part" and "second part" of the packet are here meant either parts of the packet strictly related to certain time periods from e.g. the start of the reception of the packet, i.e. the first part may correspond to the part of the packet received during the first 8 μs of reception, while the second part may correspond to the upcoming 32 μs, or parts of the packet related to the content of the packet, e.g. the first part may relate to the preamble of the packet and the second part may relate to the synchronization word in the packet, e.g. a first part may be a part of the packet starting at the detection of the start of the preamble (also referred to as "energy detect") and ending at the detection of the synchronization word, and the second part may be a part of the packet starting at the detection of the synchronization word and ending at the detection of the PDU header. A combination of both previous examples is also within scope of the disclosure, e.g. a first part may be a part of the packet starting at the detection of the start of the packet and ending after a certain amount of time, and the second part may be a part of the packet starting at the detection of the synchronization word and ending at the detection of the PDU header.

According to example embodiments, the receiver may comprise a buffer connected to the output of the demodulator for buffering at least a portion of the demodulated signal.

A part of the demodulated signal may be acted upon while in the buffer, in some embodiments. That is, by buffering a portion of the demodulated signal, a processing unit may alter the content of the buffer before outputting the content of the buffer to subsequent processing.

By the term "buffer" is here meant a unit that is adapted to temporarily store data in analog or digital form. According to an example embodiment, the buffer is a shift register adapted to store a digital word corresponding to the length of the synchronization word in the test signal.

The buffer may be implemented by electronic circuitry (a hardware shift register), computer program code portions which when executed in e.g. digital signal processor perform the function of the buffer (storing the data in a memory), or a mix thereof.

The receiver may comprise a comparator connected to the output of the demodulator and an output of the high-pass filters, and adapted to provide a correction signal to an input of the buffer based on a difference between the demodulated signal and a filtered demodulated signal.

In some embodiments, the content of the buffer may be corrected based on the amount of CFO present in the demodulated signal. In such scenarios, it may be possible to correct the first samples of the demodulated signal, fed to the buffer, with the latest CFO estimate.

The "comparator" may be in the form of a unit implemented in hardware, software or a combination of both, whose function in general terms is to provide a signal indicative of the difference between the demodulated signal and a filtered version of the demodulated signal. That is, at any time instant the content of the buffer may be corrected with the most recent CFO estimate.

The method may comprise: receiving an RF signal in the form of a modulated carrier signal with a predetermined carrier frequency, and demodulating a carrier frequency offset, CFO, present in the RF signal into a DC offset.

In some embodiments, subsequent processing of the received data in order to correct the received data with a CFO estimate is facilitated. That is, by demodulating the CFO into a DC offset, a high-pass filter may be selected for subsequent filtering such that the CFO may be compensated for.

The method may comprise selecting one of the plurality of filters based on the CFO.

Based on the amount of CFO present in the received signal, a filter may be selected for processing the demodulated signal.

The method may comprise buffering at least a portion of the demodulated signal and correcting the buffered at least a portion based on a difference between the demodulated signal and the high-pass filtered demodulated signal.

In some embodiments, a part of the demodulated signal may be acted upon while in the buffer. That is, by buffering a portion of the demodulated signal, the buffered signal may easily be corrected based on the amount of CFO present in the demodulated signal. As such, it may be possible to correct the first samples of the demodulated signal, fed to the buffer, with the latest CFO estimate.

According to example embodiments, a receiver is provided comprising: a demodulator adapted to demodulate a radio frequency, RF, signal received at an input thereof and to output a demodulated signal, high-pass filter connected to an output of the demodulator for receiving the demodulated signal, wherein the high-pass filter is adapted to operate with a first filter response during a first predetermined time period of the demodulated signal and operate with a second filter response during a second predetermined time period of the demodulated signal Other features will appear from the following detailed disclosure, from the attached claims as well as from the drawings.

Generally, all terms used in the claims are to be interpreted according to their ordinary meaning in the technical field, unless explicitly defined otherwise herein. All references to "a/an/the [element, device, component, step, etc]" are to be interpreted openly as referring to at least one instance of the element, device, component, step, etc., unless explicitly stated otherwise. The steps of any method disclosed herein do not have to be performed in the exact order disclosed, unless explicitly stated.

BRIEF DESCRIPTION OF THE DRAWINGS

The above, as well as additional features, will be better understood through the following illustrative and non-limiting detailed description of example embodiments, with reference to the appended drawings, where the same reference numerals will be used for similar elements, wherein.

DETAILED DESCRIPTION

Figure 1:
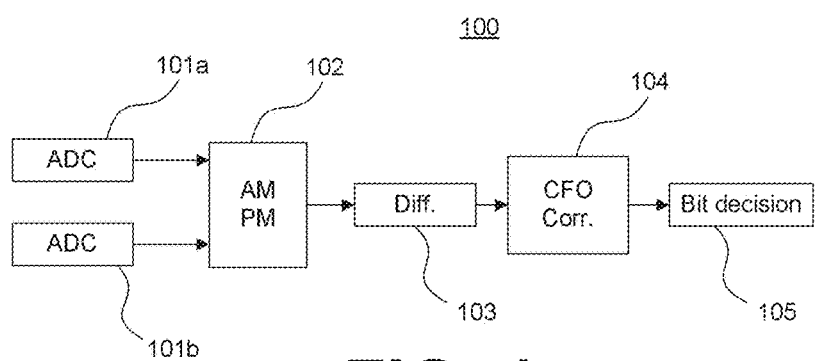
FIG. 1 is a schematic block diagram of a receiver, according to example embodiments.

FIG. 1 is a block diagram illustrating an overview a receiver 100, according to example embodiments. The in-phase (I) and quadrature (Q) signal components may be converted to digital format in a pair of analog-to-digital converters (ADC) 101a, 101b. The digital signals are then converted into the phase domain by PM block 102 and further into differential phase domain by differential block 103 for further processing of the signals in the differential phase domain, which is equivalent to the FM domain. Processing in the differential phase domain may provide that the carrier frequency offset (CFO) becomes a direct current (DC) offset in the differential phase domain.

A CFO correction block 104, which is disclosed in detail below, receives the signals from the differential block 103 and its output signal is provided to a bit decision block 105.

Figure 2:
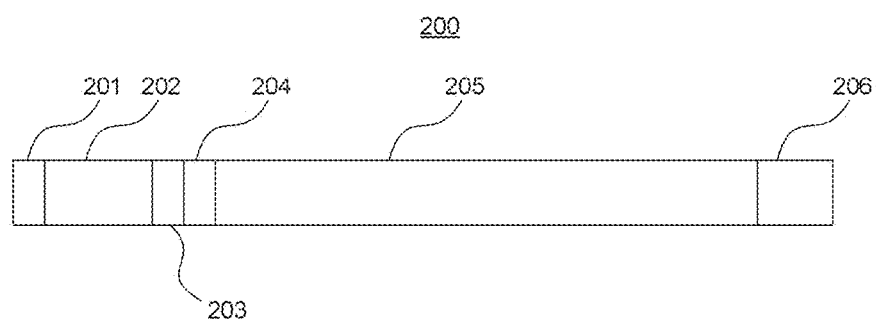
FIG. 2 diagrammatically illustrates a test packet according to the BLE test specification document, according to example embodiments.

FIG. 2 illustrates a typical test packet 200 used according to the test specification document. As indicated above, the packet comprises a preamble (1 octet) 201, a synchronization word (4 octets) 202, a PDU header (1 octet) 203, PDU length data (1 octet) 204, PDU payload (37 octets) 205 and CRC (3 octets) 206.

As the CFO is changed during a test of the receiver 100, a challenge for any receiver is to estimate and compensate for the CFO. This is especially important for BLE applications since the preamble 201 is very short, i.e. 8 symbols which correspond to 8 μs at a transfer rate of 1 Mbps. Additionally, the carrier can drift during reception of the PDU payload 205.

Figure 3:
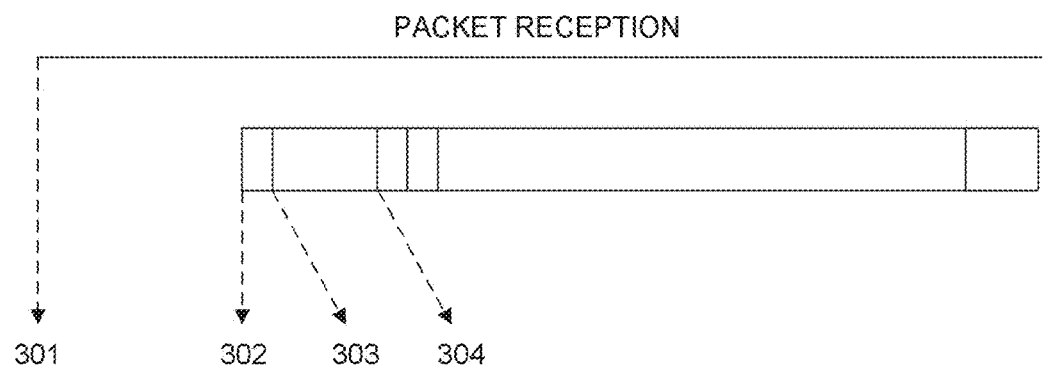
FIG. 3 diagrammatically illustrates the use of different filter parameters, according to example embodiments.
Figure 4:
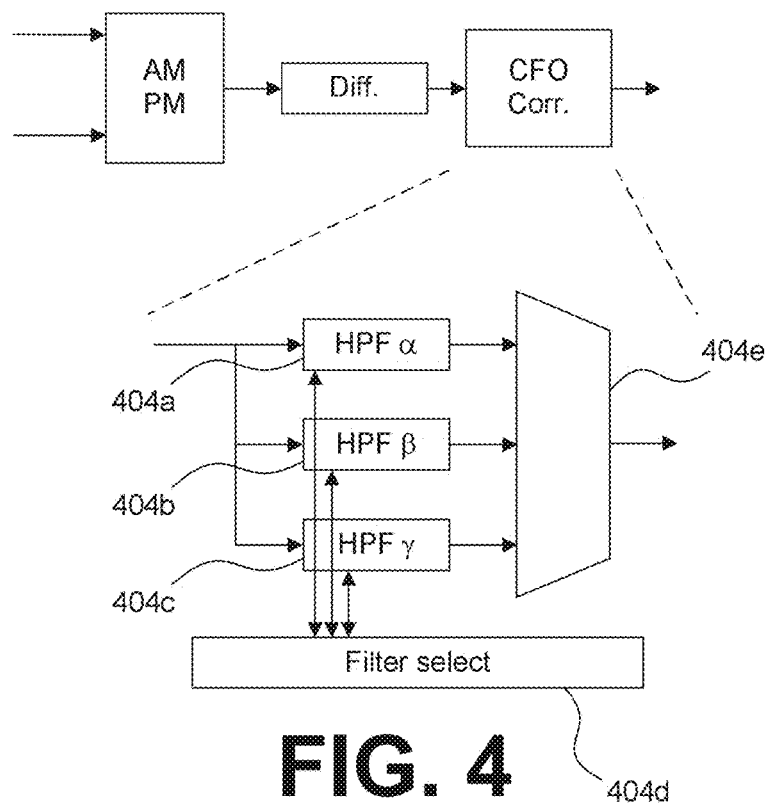
FIG. 4 is a schematic block diagram of a filter selection unit, according to example embodiments.

With reference to FIGS. 3 and 4, to compensate for the CFO, some embodiments employ a DC offset cancellation strategy in the differential phase domain. As mentioned above, the CFO manifests itself as DC offset in the differential phase domain. This makes it possible to filter the demodulated signal via a set of high-pass filters 404a-c. As disclosed in detail below, to increase the convergence speed, the filters 404a-c are gear shifted depending on which part of the packet that is currently processed.

When the receiver is enabled, initial filter parameters are loaded 301 into the filters 404a-c. Typically the filters are set to "transparent", indicated by the filter parameters α[0], β[0], γ[0] in FIG. 3, which means that by loading parameters α[0], β[0], γ[0] into the filters 404a-c, the response of the filters 404a-c will be such that a signal received at the input of the filters will pass through the filters unaffected (i.e. unfiltered).

Figure 5:
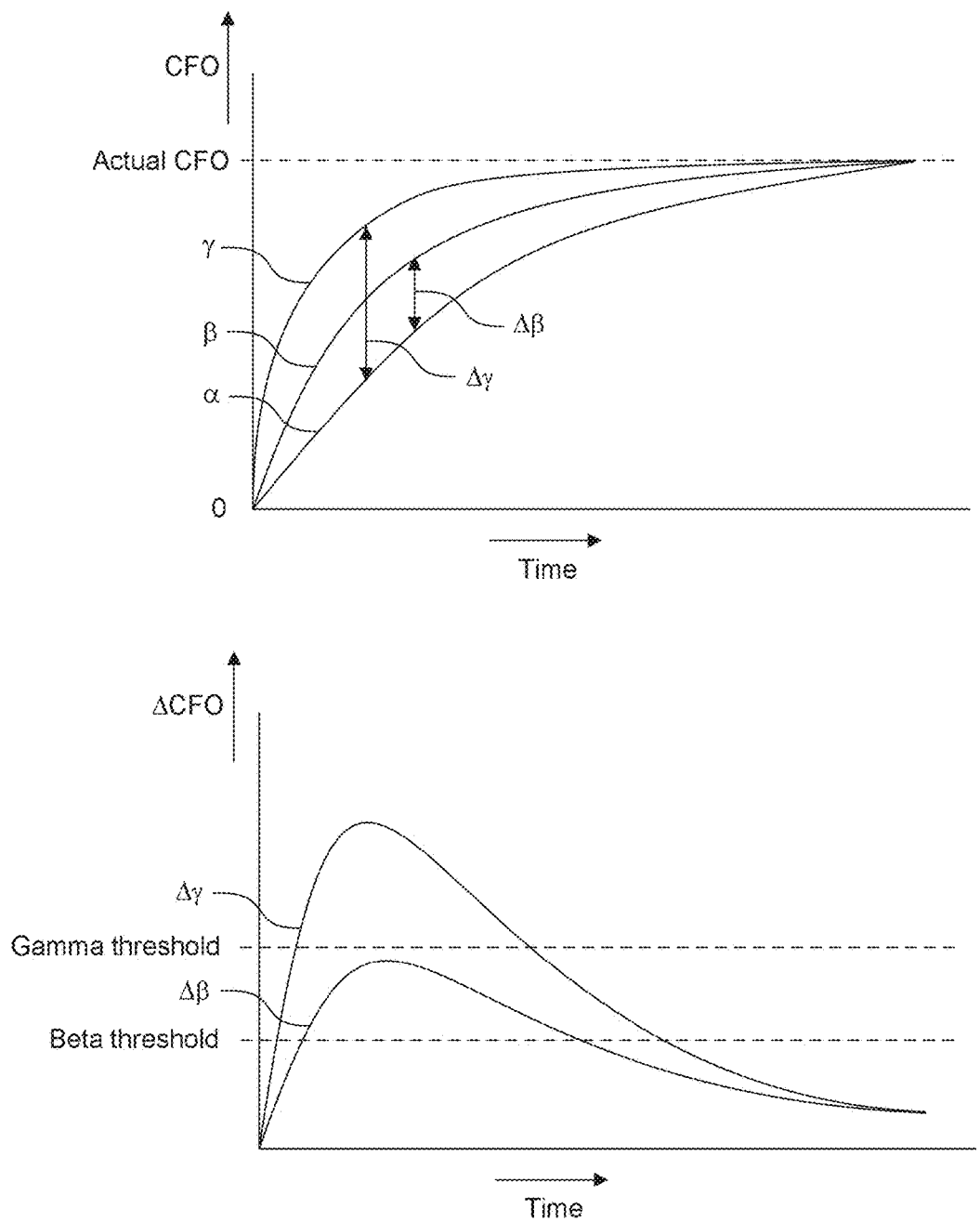
FIG. 5 diagrammatically illustrates the convergence speed of different filters, according to example embodiments.

At energy detect, i.e. at detection of the preamble 201, the filters 404a-c are gear shifted, i.e. new filter parameters α[1], β[1], γ[1] are loaded 302 into the filters 404a-c. The filter parameter α[1] defining filter "HPF α" 404a in FIG. 4 is used for moderate CFO, filter parameter β[1] defining filter "HPF β" 404b is used for intermediate CFO, and filter parameter γ[1] defining filter "HPF γ" 404c is used for large CFO. As illustrated in FIG. 5, the filter parameter γ[1] provides a faster convergence of filter "HPF γ" 404c compared to filter parameter β[1] of filter "HPF β" 404b, which in turn has faster convergence than filter "HPF α" 404a defined by filter parameter α[1].

The outputs from the filters 404a-c are monitored by a filter selection unit 404d which determines the slowest of the filters 404a-c that is able to detect the CFO and provides the output of that filter for further processing via a multiplexer 404e. Thus, by the provision of the different filters 404a-c, and the selection of the slowest possible filter, it is possible to compensate for the CFO during the processing of the first part of the packet while at the same time minimizing the impact of the filtering on the demodulated signal.

A period after energy detect, at the start of the synchronization word 202, new filter parameters α[2], β[2], γ[2] are loaded 303 into the filters 404a-c (i.e. the filters are gear shifted). Each of the new filter parameters provides a filter response that is slower compared to what is provided with the corresponding filter parameter loaded into the filters during reception of the preamble 201. That is α[2] provides a slower filter response than α[1], β[2] a slower filter response than β[1], and γ[2] a slower filter response than γ[1]. By this provision the damaging effect of the filtering of the demodulated signal is mitigated. That is, due to its content, the preamble 201 is less prone to being corrupted compared to the synchronization word 202, wherein a more aggressive filtering of the preamble in order to detect the CFO may be employed.

When the synchronization word 202 has been received, i.e. at the start of the PDU 203, new filter parameters α[3], β[3], γ[3] are loaded 304 into the filters 404a-c. Each of the new filter parameters may provide a slower filter response than the corresponding filter parameter loaded into the filters during reception of the synchronization word 201. In an alternative embodiment each of the new filter parameters provides a faster response than the corresponding filter parameter loaded into the filters during reception of the synchronization word 201. In yet an alternative embodiment the filter parameters are not altered after reception of the synchronization word 201.

In the description above, an embodiment employing three different filters has been disclosed. It is, however, emphasized that more or less than three filters may be used, e.g. two, four, five, six etc. depending on how many different levels of convergence speed that is desired. By way of example, if present embodiments are employed for reception of a packet sent via the ZigBee protocol, only two filters may be used due to the structure of the ZigBee package.

Figure 6A:
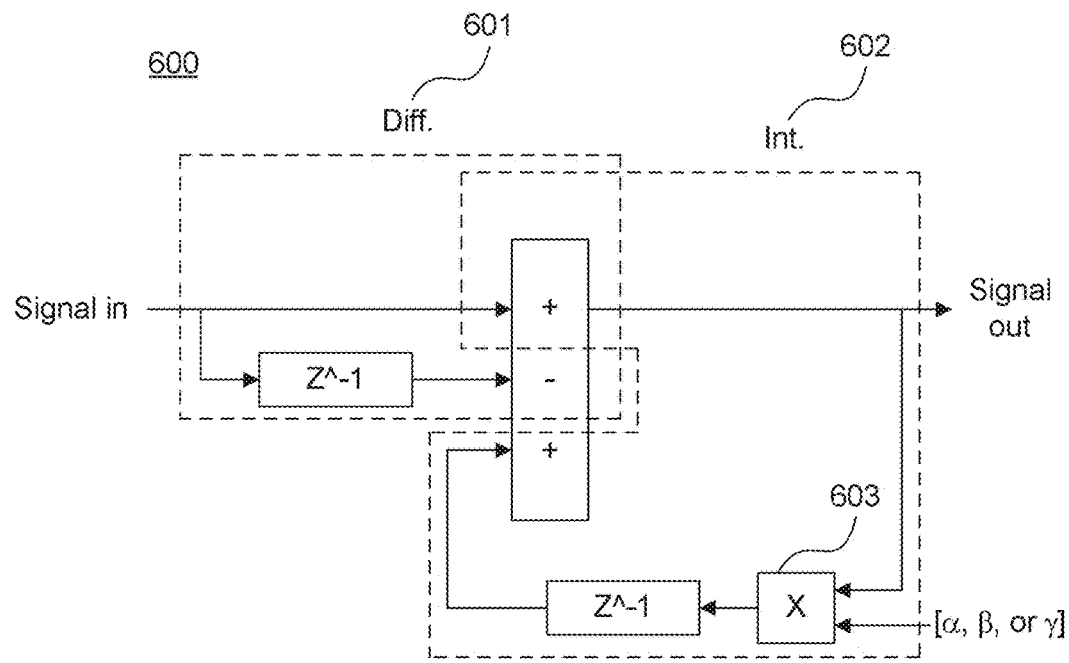
FIG. 6A is a schematic block diagram of a high-pass filter, according to example embodiments.
Figure 6B:
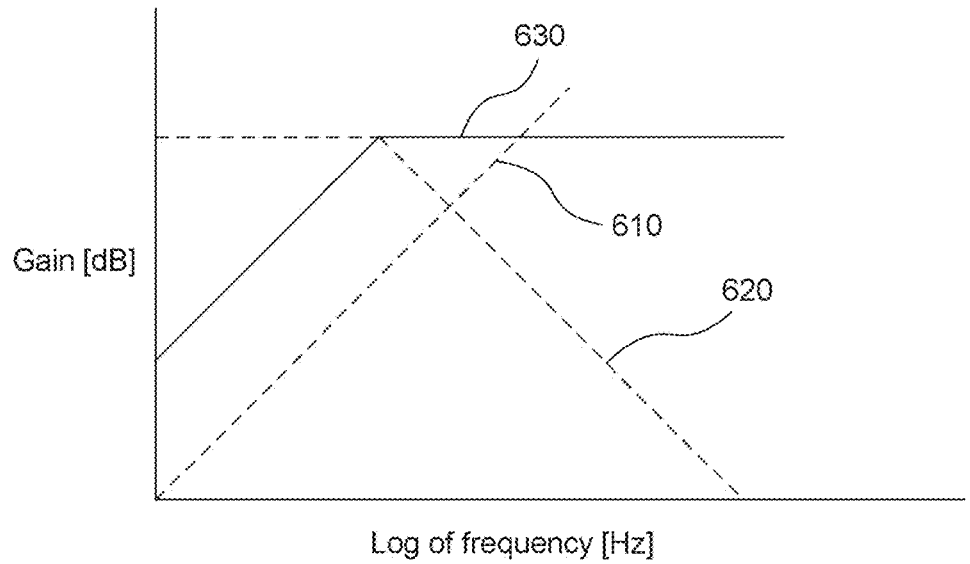
FIG. 6B is a plot of gain versus frequency, according to example embodiments.

FIG. 6A is a schematic block diagram of a high-pass filter 600, according to example embodiments. In general terms, the filter 600 comprises a differentiation block 601 connected to an integration block 602. The frequency response of the differentiation block 601 is illustrated by the dashed line 610 in FIG. 6B and the frequency response of the integration block 602 is illustrated by the dashed line 620 in FIG. 6B. The cascade coupling of the two blocks provides a total frequency response of the filter 600 as illustrated by the solid line 630 in FIG. 6B.

The feedback loop of the integrator 602 comprises a multiplication block 603 into which the filter parameters α, β, γ are loaded. Thus by providing different filter parameters, the total frequency response of the filter 600 may be altered such that the cut-off frequency of the filter is lowered or raised. Thus, by the provision of a filter structure as shown in FIG. 6A, fast and simple gear switching of the filter 600 is provided.

Figure 7:
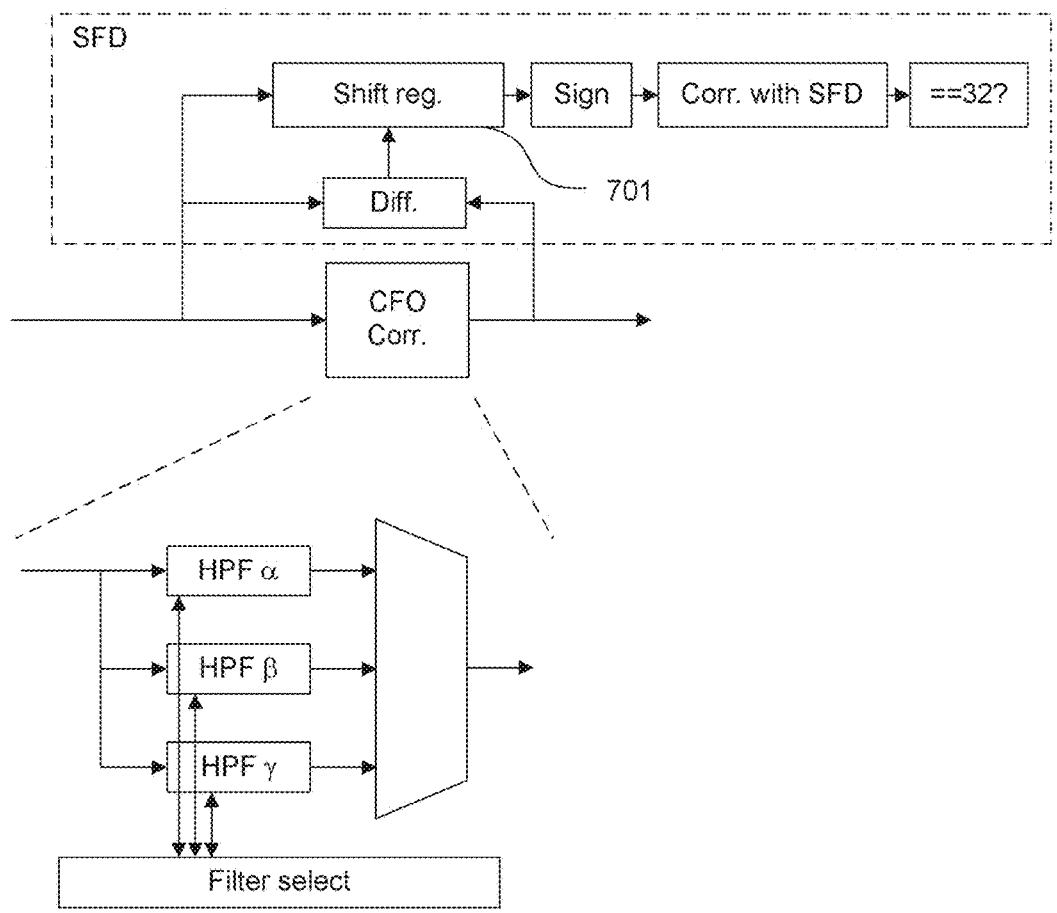
FIG. 7 is a schematic block diagram of a buffer arrangement connected to the output of the demodulator for buffering at least a portion of the demodulated signal, according to example embodiments.

FIG. 7 is a schematic block diagram of a buffer arrangement connected to the output of the demodulator for buffering at least a portion of the demodulated signal. In some embodiments, the buffer 701 is formed by a shift register, the input of which is connected to the output of the demodulator for receiving the demodulated samples. As the demodulated samples are fed into the shift register 701, the data in the shift register 701 is corrected with the most recent CFO estimate received from the CFO correction block 104. That is, by comparing the filtered and unfiltered data, an estimation of the CFO present in the signal may be estimated and continuously subtracted from the data in the shift register 701 during reception of the packet. Thus, the first samples in the shift register may be corrected with the latest known CFO estimate, effectively increasing the convergence time for the SFD. The correction of the data in the shift register is continuous in the sense that it may be performed once the shift register has been filled with data, or performed on blocks of data in the shift register as samples are fed into the shift register.

Finally, hard detect of the symbols is done based on the sign information of the corrected data in the shift register. A received synchronization word is correlated against the expected synchronization word/device address in order to determine if the synchronization word is correctly received and to determine if the packet is destined to the present receiver. The receiver returns to detecting a new preamble should the correlation show that the words do not match, otherwise the receiver continues to receive and CFO-correct the payload data of the packet.

Packet Error Rate (PER) measurement is used in all measurements testing receiver characteristics in the test specification document.

The packet error rate (PER) is defined as:

$$PER = \left(1 - \frac{\text{Number of correctly received packets}}{\text{Total number of transmitted packets}}\right) * 100$$

The sensitivity level based on bit error rate (BER) measurements is defined as the input power level at which a BER of 0.1% is achieved measured with a reference signal as described in the test specification document and packet with PRBS9 payload as described in "Bluetooth Specification v4.0, Vol 6, Part F; Direct Test Mode".

This PER requirement equates to a BER of 0.1% under the assumption that bit errors are randomly distributed with a rectangular error probability density function, and that bit errors are not correlated. Furthermore, the probability of a particular bit being in error at a BER of 0.1% is 0.001, from which it follows that the probability of a bit being OK under the same condition is 0.999.

Figure 8:
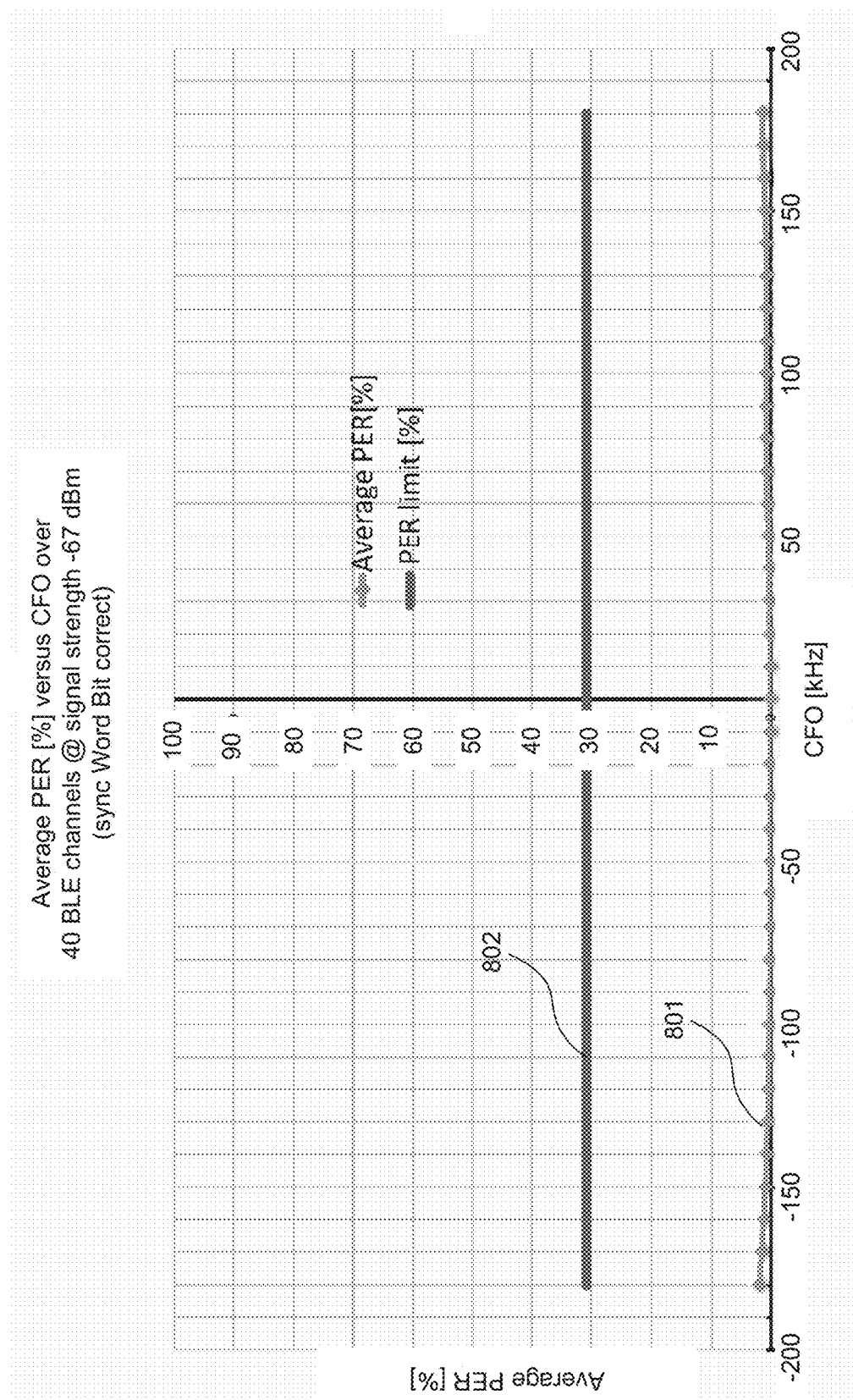
FIG. 8 illustrates measurement results obtained by a receiver, according to example embodiments.

Examining the impact of a bit error in the test packet gives that a packet is lost if a bit error is present in any part of the packet, save the 8-bit preamble. That is, the number of significant bits in an test packet is thus 368 bits (out of a total of 376 bits). Further, the probability of a 368 bit sequence containing no bit errors is $0.999^{368}=0.692$, and hence the resulting PER requirement becomes $(1-0.692)\times 100\%=30.8\%$ FIG. 8 illustrates measurement results 801 obtained by a receiver according to example embodiments. As can be seen from FIG. 8, the PER is well below the 30.8% level 802 for a CFO measurement of +/−180 ppm, while passing the test includes covering a range of +/−62 ppm.

Figure 9:
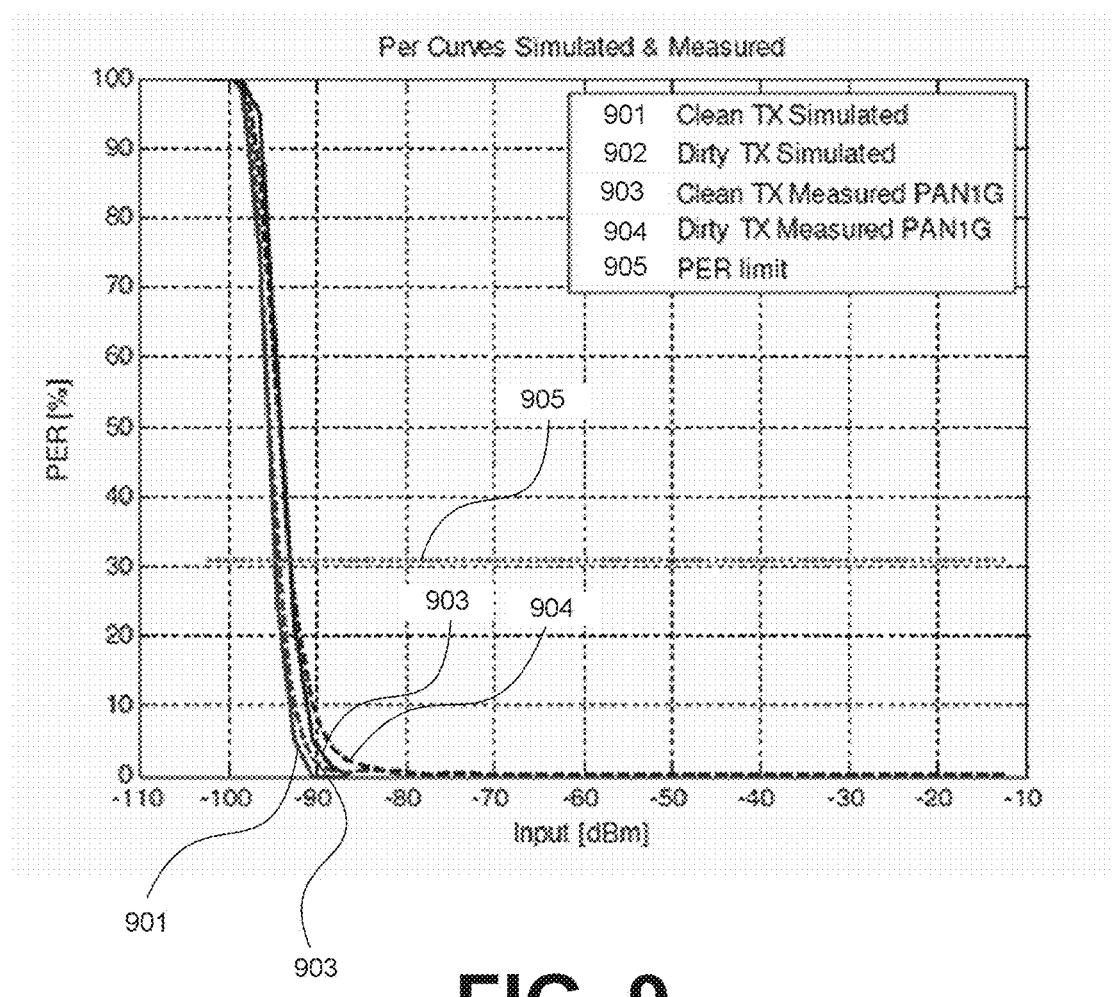
FIG. 9 illustrates simulation and measurement results, according to example embodiments.

FIG. 9 illustrates simulation 901, 902 and measurement 903, 904 results obtained, according to example embodiments. As can be seen from FIG. 9, some embodiments provide a PER well below the 30.8% 905 level for signal levels falling below −90 dBm.

Embodiments may be implemented in, for example, integrated circuits or chip sets, wireless systems, and receiver system products. For example, a processor is operative to execute software adapted to perform the demodulation techniques according to example embodiments. Demodulation software is adapted to reside on a computer readable medium, such as a magnetic disk within a disk drive unit. The computer readable medium may also include a flash memory card, EEROM based memory, ROM storage, etc. The software adapted to perform the demodulation method may also reside, in whole or in part, in the static or dynamic main memories or in firmware within a processor (i.e. within microcontroller, microprocessor or microcomputer internal memory). The demodulation method may also be applicable to implementations in integrated circuits, field programmable gate arrays (FPGAs), chip sets or application specific integrated circuits (ASICs), wireless systems, and other communication system products.

The present disclosure includes reference to a few embodiments. However, as is readily appreciated, other embodiments than the ones disclosed above are equally possible within the scope of the present disclosure, as defined by the appended patent claims.

What is claimed is:

1. A receiver comprising:
a demodulator configured to demodulate a radio frequency (RF) signal received at an input of the demodulator and configured to output a demodulated signal; and
a plurality of high-pass filters connected to an output of the demodulator,
wherein the plurality of high-pass filters are configured to receive the demodulated signal and configured to high-pass filter the demodulated signal,
wherein the plurality of high-pass filters are configured to operate with a first set of filter responses during a first time period of the demodulated signal and configured to operate with a second set of filter responses during a second time period of the demodulated signal,
wherein the receiver is configured to receive the RF signal as a modulated carrier signal with a predetermined carrier frequency, and
wherein the demodulator is configured to demodulate a carrier frequency offset (CFO) present in the RF signal into a DC offset.

2. The receiver according to claim 1,
wherein each filter response in the first set of filter responses has a corresponding filter response in the second set of filter responses, and
wherein each of the corresponding filter responses in the second set of filter responses is slower than the corresponding first filter response.

3. The receiver according to claim 1, wherein at least one of the high-pass filters comprises electronic circuitry, a portion of computer program code, or a mix of electronic circuitry and a portion of computer program code.

4. The receiver according to claim 3, further comprising a selector configured to select one of the plurality of high-pass filters based on the CFO.

5. The receiver according to claim 1, wherein the demodulator is a differential phase-domain demodulator.

6. The receiver according to claim 1, wherein the demodulated signal is a data packet.

7. The receiver according to claim 6, wherein the plurality of high-pass filters are configured to operate with the first set of filter responses on a first part of the data packet and with the second set of filter responses on a second part of the data packet.

8. The receiver according to claim 1, further comprising a buffer connected to the output of the demodulator for buffering at least a portion of the demodulated signal.

9. The receiver according to claim 8, further comprising a comparator connected to the output of the demodulator and an output of the high-pass filters, wherein the comparator is configured to provide a correction signal to an input of the buffer based on a difference between the demodulated signal and a filtered demodulated signal.

10. A method for processing a received signal comprising a modulated carrier signal of a predetermined carrier frequency, wherein the modulated carrier signal comprises a carrier frequency offset (CFO), and wherein the method comprises:
    demodulating the received signal into a demodulated signal;
    receiving the demodulated signal in a plurality of high-pass filters;
    high-pass filtering the demodulated signal using a first set of filter responses for the plurality of high-pass filters during a first time period of the demodulated signal and high-pass filtering the demodulated signal using a second set of filter responses for the plurality of high-pass filters during a second time period of the demodulated signal;
    receiving a radio frequency (RF) signal as the modulated carrier signal with the predetermined carrier frequency; and
    demodulating the CFO present in the RF signal into a DC offset.

11. The method according to claim 10, wherein each filter response in the first set of filter responses has a corresponding filter response in the second set of filter responses, and wherein each of the corresponding filter responses in the second set of filter responses is slower than the corresponding first filter response.

12. The method according to claim 10, wherein at least one of the high-pass filters comprises electronic circuitry, a portion of computer program code, or a mix of electronic circuitry and a portion of computer program code.

13. The method according to claim 12, further comprising selecting one of the plurality of high-pass filters based on the CFO.

14. The method according to claim 10, further comprising:
    buffering at least a portion of the demodulated signal; and
    correcting the buffered portion based on a difference between the demodulated signal and the high-pass filtered demodulated signal.

15. A plurality of high-pass filters,
    wherein the plurality of high-pass filters are configured to be connected to an output of a demodulator,
    wherein the demodulator is configured to demodulate a radio frequency (RF) signal received at an input of the demodulator and configured to output a demodulated signal,
    wherein the plurality of high-pass filters are configured to receive the demodulated signal and configured to high-pass filter the demodulated signal,
    wherein the plurality of high-pass filters are configured to operate with a first set of filter responses during a first time period of the demodulated signal and configured to operate with a second set of filter responses during a second time period of the demodulated signal,
    wherein the demodulator is configured to receive the RF signal as a modulated carrier signal with a predetermined carrier frequency, and
    wherein the demodulator is configured to demodulate a carrier frequency offset (CFO) present in the RF signal into a DC offset.

16. The plurality of high-pass filters according to claim 15,
    wherein each filter response in the first set of filter responses has a corresponding filter response in the second set of filter responses, and
    wherein each of the corresponding filter responses in the second set of filter responses is slower than the corresponding first filter response.

17. The plurality of high-pass filters according to claim 15, wherein the demodulator is a differential phase-domain demodulator.

18. The plurality of high-pass filters according to claim 15, wherein the demodulated signal is a data packet.

19. The plurality of high-pass filters according to claim 18, wherein the plurality of high-pass filters are configured to operate with the first set of filter responses on a first part of the data packet and with the second set of filter responses on a second part of the data packet.

20. The plurality of high-pass filters according to claim 15, wherein the output of the demodulator is connected to a buffer for buffering at least a portion of the demodulated signal.

* * * * *